(12) United States Patent
Hofmann et al.

(10) Patent No.: US 7,154,138 B2
(45) Date of Patent: Dec. 26, 2006

(54) TRANSISTOR-ARRANGEMENT, METHOD FOR OPERATING A TRANSISTOR ARRANGEMENT AS A DATA STORAGE ELEMENT AND METHOD FOR PRODUCING A TRANSISTOR-ARRANGEMENT

(75) Inventors: Franz Hofmann, Munich (DE); Josef Willer, Riemerling (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/481,278

(22) PCT Filed: Jun. 20, 2002

(86) PCT No.: PCT/DE02/02263

§ 371 (c)(1),
(2), (4) Date: May 17, 2004

(87) PCT Pub. No.: WO03/003472

PCT Pub. Date: Jan. 9, 2003

(65) Prior Publication Data

US 2004/0207038 A1    Oct. 21, 2004

(30) Foreign Application Priority Data

Jun. 26, 2001    (DE) ................ 101 30 765

(51) Int. Cl.
*H01L 27/108*    (2006.01)
*H01L 29/76*    (2006.01)
*H01L 29/788*    (2006.01)
*H01L 29/94*    (2006.01)

(52) U.S. Cl. ............... 257/302; 257/314; 257/315; 257/316

(58) Field of Classification Search ........ 257/314–316, 257/302; 438/259
See application file for complete search history.

(56) References Cited

U.S. PATENT DOCUMENTS

| 5,739,567 | A | * | 4/1998 | Wong .................... 257/316 |
| 5,969,383 | A | | 10/1999 | Chang et al. |
| 6,087,222 | A | | 7/2000 | Jung Lin et al. |
| 6,157,061 | A | | 12/2000 | Kawata |
| 6,191,459 | B1 | | 2/2001 | Hofmann et al. |
| 6,204,529 | B1 | | 3/2001 | Lung et al. |
| 6,335,554 | B1 | | 1/2002 | Yoshikawa |
| 2003/0134475 | A1 | | 7/2003 | Hofmann et al. |

FOREIGN PATENT DOCUMENTS

| DE | 10036911 | 2/2002 |
| JP | 5-251669 | 9/1993 |

(Continued)

OTHER PUBLICATIONS

Widmann, D. et al., "Technologie hochintergrierter Schaltungen," [Technology of Largescale Integrated Circuits], Chapter 8.4, Springer Verlag, Berlin, IBSN 3-540-59357-8, 1996.

(Continued)

*Primary Examiner*—Chuong Anh Luu
(74) *Attorney, Agent, or Firm*—Dicke, Billig & Czaja, PLLC

(57) ABSTRACT

The invention relates to a transistor arrangement having a substrate and a vertical transistor comprising: a first electrode region, a second electrode region arranged essentially above the latter, and, in between, a channel region, and also a gate region beside the channel region and, in between, an electrically insulating layer sequence, wherein two mutually spatially separate sections of the electrically insulating layer sequence in each case serve for the storage of charge carriers.

6 Claims, 6 Drawing Sheets

FOREIGN PATENT DOCUMENTS

| | | |
|---|---|---|
| JP | 8-162547 | 6/1996 |
| JP | 2001 156188 | 6/2001 |
| WO | WO 98/06139 | 2/1998 |

OTHER PUBLICATIONS

Patent Abstracts of Japan, vol. 1996, No. 10, Oct. 31, 1996, Abstract of JP 08-162547.

Eitan, B., et al., "NROM: A Novel Localized Trapping, 2-Bit Nonvolatile Memory Cell," IEEE Electron Device Letters, vol. 21, No. 11, pp. 543-545, 2000.

Patent Abstracts of Japan, vol. 2000, No. 23, Feb. 10, 2001, Abstract of JP 2001-156188.

* cited by examiner

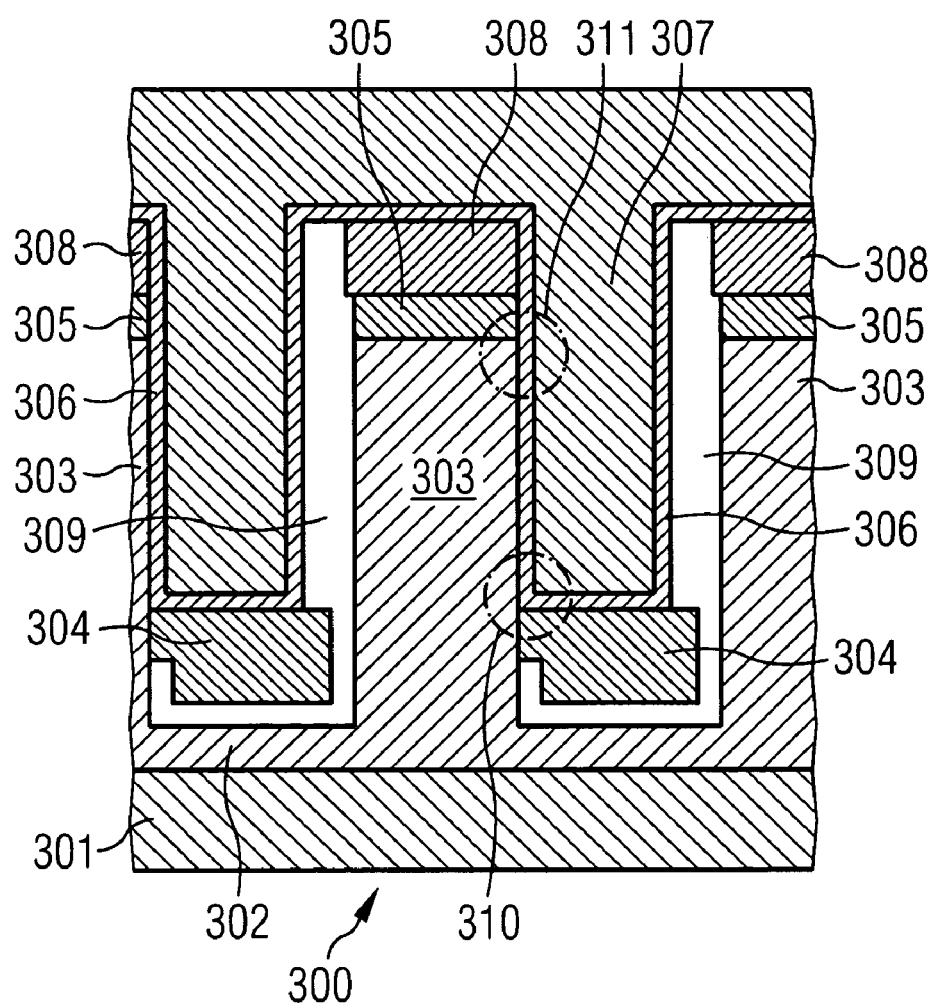

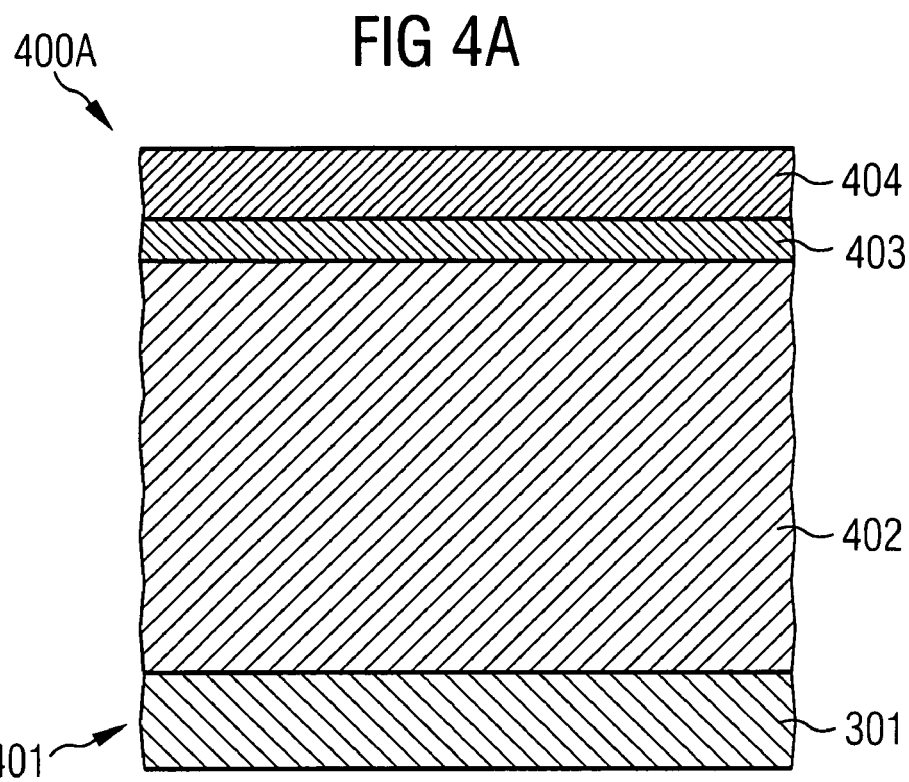
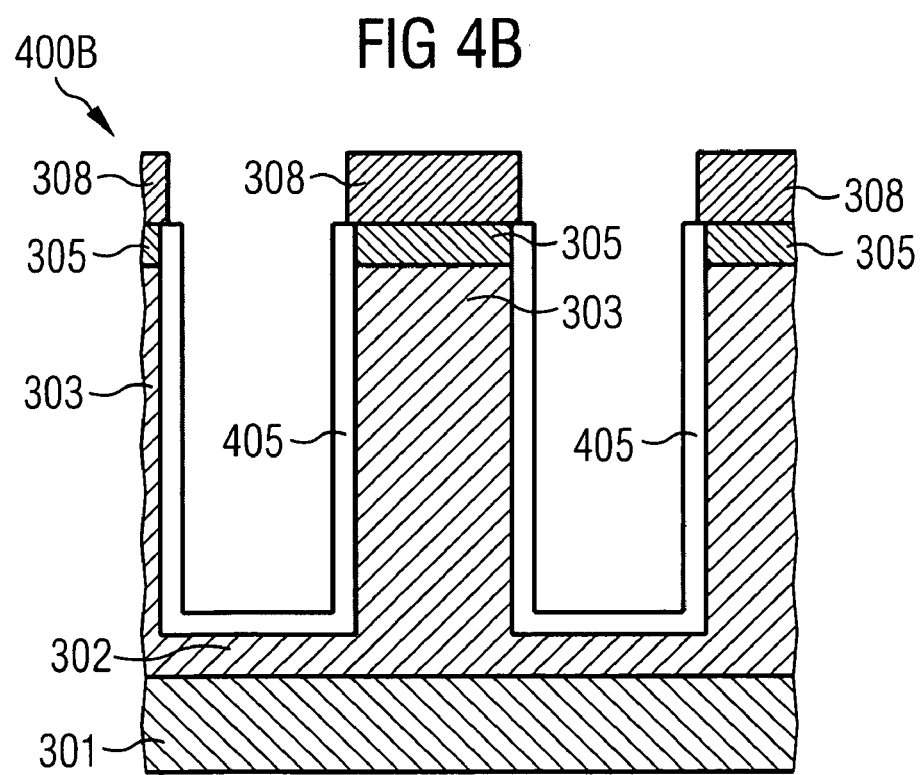

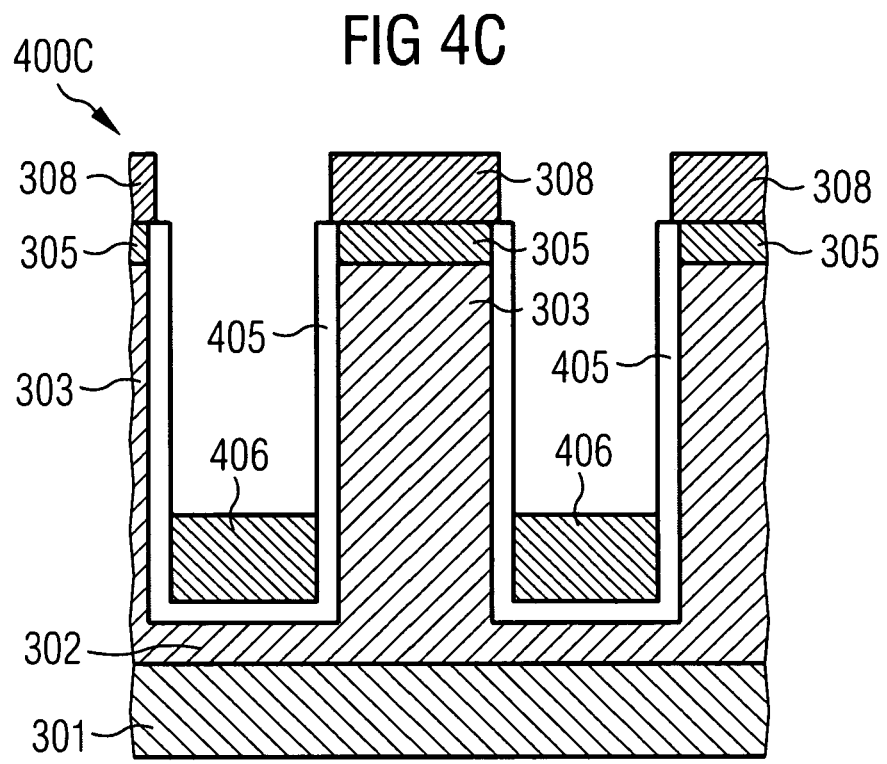
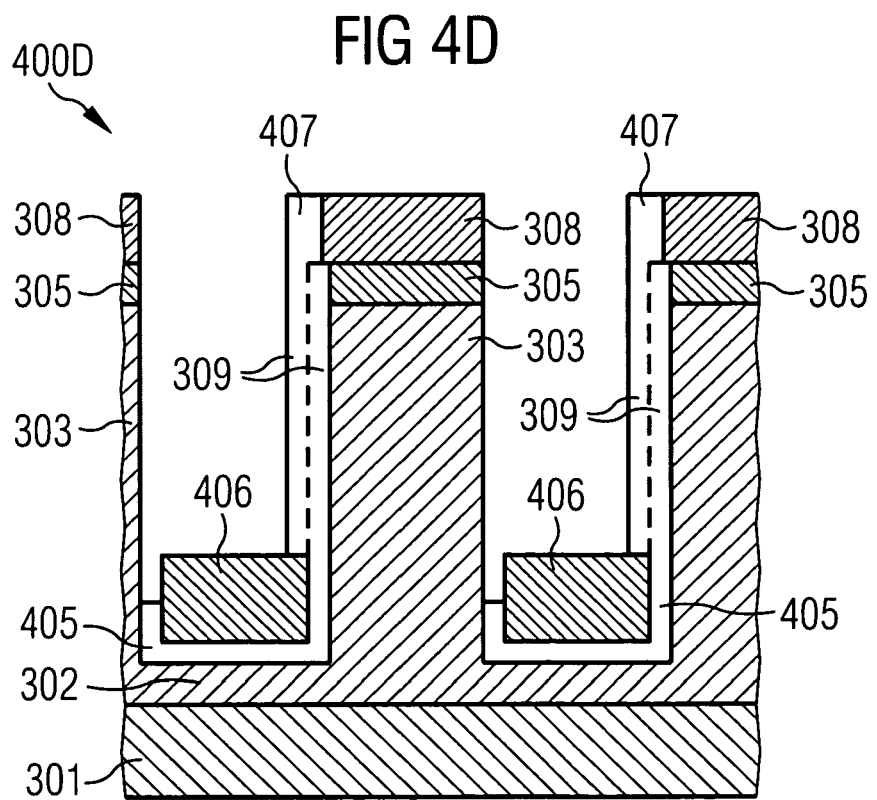

TRANSISTOR-ARRANGEMENT, METHOD FOR OPERATING A TRANSISTOR ARRANGEMENT AS A DATA STORAGE ELEMENT AND METHOD FOR PRODUCING A TRANSISTOR-ARRANGEMENT

CROSS-REFERENCE TO RELATED APPLICATION

This application is a U.S. National-Stage entry under 35 U.S.C. § 371 based on International Application No. PCT/DE02/02263 filed Jun. 20, 2002, which was published under PCT Article 21(2); this application also claims priority under 35 U.S.C. § 119 to German Application No. 101 30 765.9 filed Jun. 26, 2001.

BACKGROUND

The invention relates to a transistor arrangement, a method for operating a transistor arrangement as a data memory and a method for fabricating a transistor arrangement.

In view of the rapid ongoing development of computer technology, there is a need for storage media which provide ever-greater storage quantities on ever-smaller arrangements. Large quantities of data are usually stored in a large arrangement of memory cells. Memory cells used are, for example, nonvolatile memories which can store a stored information item for a long period of time without loss of information. An overview of nonvolatile memories is given by Widmann D., Mader H., Friedrich H.: "Technologie hochintegrierter Schaltungen" [Technology of Largescale Integrated Circuits], Chapter 8.4, Springer Verlag, Berlin, IBSN 3-540-59357-8 (1996), for example. Special transistors on silicon chips are usually used as nonvolatile memories.

Conventional silicon microelectronics will, however, encounter limits as miniaturization progresses further. In particular, the development of increasingly smaller and more densely arranged transistors of hundreds of millions of transistors per chip will be subject to fundamental physical problems in the next ten years. When structure dimensions fall below 80 nm, quantum effects will have a disturbing influence on the components situated on the chips, and will predominate below dimensions of about 30 nm.

Moreover, the increasing integration density of the components on the chips leads to undesirable crosstalk between the components situated on the chips and to a dramatic increase in waste heat. Therefore, increasing the storage density of transistor arrangements by means of advancing miniaturization of the transistor dimensions is a concept which will encounter physical limits in the foreseeable future.

Therefore, concepts are being pursued which seek alternatives to the progressive miniaturization of the extent of individual transistors. One concept which is being pursued in order to further increase the storage density is based on the basic idea of storing a quantity of data of more than one bit in one transistor.

Eitan B., Pavan P., Bloom I., Aloni E., Frommer A., Finzi D.: "NROM: A Novel Localized Trapping, 2-Bit Nonvolatile Memory Cell", IEEE Electron Device Letters, Vol. 21, No. 11, pp. 543–545 (2000) discloses a nonvolatile memory in which a storage quantity of two bits can be stored in one transistor. The method of operation of such a nonvolatile memory is described in more detail below. FIG. 1 shows a 2-bit memory transistor 100 having a gate region 101, a source region 102, a drain region 103, a well region 104, a first electrically insulating layer 105 and a second electrically insulating layer 106. Furthermore, the 2-bit memory transistor 100 has an electrically insulating ONO layer 107 containing a first oxide layer 108 made of silicon dioxide ($SiO_2$), a nitride layer 109 made of silicon nitride ($Si_3N_4$), and a second oxide layer 110 made of silicon dioxide ($SiO_2$). Moreover, the 2-bit memory transistor 100 has a first memory section 111 and a second memory section 112, which are arranged at the two lateral edge sections of the nitride layer 109 in the ONO layer 107. The gate region 101 is preferably fabricated from n-doped polysilicon material. The two electrically insulating layers 105, 106 are formed from silicon dioxide ($SiO_2$).

A quantity of data of one bit can in each case be stored in the two memory sections 111, 112, as described hereinafter. If a first, sufficiently large voltage is applied to the gate region 101 and a second, sufficiently large voltage is applied to the source region 102, this brings about tunneling of accelerated, so-called "hot", electrons to the nitride layer 109 in the first memory section 111 of the ONO layer 107 in the vicinity of the source region 102. These electrons are then situated, in the electrically insulating nitride layer 109 in accordance with FIG. 1, immobile in the horizontal direction in the first memory section 111. The electrons cannot flow away from the first memory region 111 via the—in accordance with FIG. 1—vertically adjacent electrically insulating oxide layers 108 and 110.

The electrons injected into the ONO layer 107 from the drain region 103 via the source region 102 thus represent a fixed electrical charge. This fixed electrical charge is thus permanently localized, i.e. clearly trapped, in a region of the ONO layer 107 near the source region 102.

The application of a first, sufficiently large voltage to the gate region 101 and of a second, sufficiently large voltage to the drain region 103 analogously brings about tunneling of accelerated electrons to the nitride layer 109 in the second memory section 112 of the ONO layer 107 in the vicinity of the drain region 103. The electrons are then situated in the electrically insulating nitride layer 109 in accordance with FIG. 1 immobile in the horizontal direction in the second memory section 112 and also cannot flow away via the—in accordance with FIG. 1—vertically adjacent electrically insulating oxide layers 108 and 110. In particular, charge balancing of the electrons which are situated in the first memory section 111 and/or in the second memory section 112 is not effected along the nitride layer 109, since electrical charges cannot be transported along the electrically insulating nitride layer 109.

The presence of an electrical charge in the first memory section 111 is interpreted as a first logic value "1", whereas an absence of an electrical charge in the first memory section 111 is interpreted as a second logic value "0". Therefore, a quantity of data of one bit can be stored in the first memory section 111 of the ONO layer 107. The presence of an electrical charge in the second memory section 112 is interpreted as a first logic value "1", whereas an absence of an electrical charge in the second memory section 112 is interpreted as a second logic value "0". Therefore, a quantity of data of one bit can also be stored in the second memory section 112 of the ONO layer 107. Consequently, a storage quantity of two bits can be stored in the 2-bit memory transistor 100.

The electrons permanently localized in the two memory sections 111, 112 influence the threshold voltage of the 2-bit memory transistor 100 in a characteristic manner. The two quantities of data of in each case one bit that are stored in the memory sections 111, 112 can be read out by a first, sufficiently small voltage being applied to the source region 102 or the drain region 103, on the one hand, and a second, sufficiently small voltage being applied to the gate region 101, on the other hand. The two voltages are to be chosen to be small enough to prevent an undesirable tunneling of electrons from or to the nitride layer 109. The threshold voltage of the 2-bit memory transistor 100 is therefore clearly dependent on the presence and the absence, respectively, of free charge carriers on the nitride layer 109, since the free charge carriers have an influence on the conductivity of the arrangement and, consequently, on the current flow.

The method described in the Eitan reference described above for reading out the quantity of data stored in the memory section 111 near the source region 102 and the memory section 112 near the drain region 103, respectively, is effected in the "opposite" direction to programming. That is, to read from the memory section 111 near the source region 102, a voltage is applied to the drain region 103 and a further voltage is applied to the gate region 101. In contrast to this, in order to program the memory section 111 near the source region 102, a voltage is applied to the source region 102 and a further voltage is applied to the gate region 101. In order to read from the memory section 112 near the drain region 103, a voltage is applied to the source region 102 and a further voltage is applied to the gate region 101. The reading from the two memory sections 111, 112 in the "opposite" direction (compared with programming) enables an accelerated programming operation since smaller quantities of charge localized in the ONO layer 107 are sufficient during read-out in the "opposite" direction.

From the 2-bit memory transistors 100 described it is possible to construct arrangements having a plurality of such 2-bit memory transistors 100, such an arrangement enabling a doubled storage density in comparison with conventional memory arrangements of transistors, each of which can store a storage quantity of one bit.

However, in order to program the 2-bit memory transistors 100, it is necessary, as described above, to apply a sufficiently high voltage to the source region 102 or to the drain region 103.

If the structure sizes fall below approximately 150 nm, the high voltages required can no longer be applied to the source region 102 and to the drain region 103, respectively, without an undesirable current flow occurring between source region 102 and drain region 103. This parasitic punch-through of the space charge zone from the source region 102 to the drain region 103 adversely influences the data programmed in the two memory sections 111, 112, and the electrons permanently localized in the ONO layer 107, respectively.

A punch-through of the space charge zone between the source region 102 and the drain region 103 with the disadvantageous consequences described can be avoided by providing the horizontal extent—in accordance with FIG. 1—of the channel between the source region 102 and the drain region 103 in sufficiently large fashion. As a result, an overlap between the space charge zone formed around the source region 102 and the space charge zone formed around the drain region 103 is avoided and the two memory sections 111, 112 can then be operated with the high voltages required, without the occurrence of the disadvantageous effects described above. However, a horizontal lengthening of the channel between the source region 102 and the drain region 103, that is to say a lengthening of the ONO layer 107 in accordance with FIG. 1 in the horizontal direction, is associated with an increased area requirement of a transistor in a memory arrangement having a multiplicity of such transistors. This counteracts the aim sought, namely that of achieving the highest possible storage density, that is to say storable quantity of data per area of the arrangement.

This restriction has the effect that the 2-bit memory transistor 100 disclosed in the Eitan reference is limited to linear dimensions of not less than 150 nm. Further miniaturization is not possible by means of this arrangement. This is disadvantageous with regard to the pursued aim of providing transistors having the highest possible storage density and also having the shortest possible signal propagation times.

U.S. Pat. No. 6,087,222 A discloses a nonvolatile memory unit in which a plurality of 1-bit memory transistors are arranged one beside the other. In each case a drain electrode, a channel region, a source region, a control gate electrode and a floating gate electrode together form a 1-bit memory transistor. In this case, each 1-bit memory transistor is arranged essentially vertically with respect to the surface of the nonvolatile memory unit. The floating gate electrode consists of an electrically conductive material and serves, in each individual 1-bit memory transistor, as a data memory in which a storage quantity of one bit can be stored in each case. In order to ensure suitable electrical insulation of each control gate electrode from the remaining components of the 1-bit memory transistors, the control gate electrodes are embedded in a respective ONO layer and thus electrically decoupled from the drain electrodes, the channel regions and the floating gate electrodes.

U.S. Pat. No. 6,191,459 B1 discloses an electrically programmable memory cell arrangement whose memory cells have a vertical MOS transistor.

JP 8 162 547 A discloses a semiconductor memory cell with a vertical floating gate region.

U.S. Pat. No. 6,204,529 B1 discloses a nonvolatile semiconductor memory in which up to eight bits of information can be stored.

JP 2001 156 188 A describes a planar semiconductor memory cell in which a plurality of bits of information can be stored in a charge storage layer.

DE 100 36 911 A1 discloses a planar multibit memory cell.

U.S. Pat. No. 5,969,383 A discloses a planar EEPROM memory cell in which charge carriers can be injected into an ONO layer.

JP 5 251 669 A discloses a memory arrangement in which adjacent memory cells are electrically insulated from one another by means of a pn junction.

SUMMARY OF THE INVENTION

Consequently, it is an object of the invention to provide an arrangement of 2-bit memory transistors having an increased storage density. The problem is solved by means of a transistor arrangement, a method for operating a transistor arrangement as a data memory and a method for fabricating a transistor arrangement.

A transistor arrangement has a substrate and a vertical transistor. The vertical transistor has, for its part: a first electrode region, a second electrode region, which is arranged essentially above the first electrode region, a channel region between the first electrode region and the second electrode region, a gate region beside the channel region, and an electrically insulating layer sequence between the gate region and the channel region. In this case, two mutually spatially separate and electrically decoupled sections of the electrically insulating layer sequence in each case serve for the storage of charge carriers.

A basic idea of the invention is based on the fact that, in order to further increase the storage density, 2-bit memory transistors are integrated vertically instead of in planar fashion in the chips and the planar dimensions of the individual transistors in the chips are reduced in this way. The source electrode and the drain electrode are formed from the two electrode regions of a transistor when a voltage is applied to the transistor. In this case, the source electrode has a lower potential than the drain electrode.

Consequently, according to the invention, two locally separate memory sections are formed in the electrically insulating layer sequence, one memory section being arranged on the source side and the other memory section being arranged on the drain side in the electrically insulating layer sequence. The channel that forms between first electrode region and second electrode region can additionally have a sufficient size, decoupled from the planar dimensions. It is thus ensured that the memory regions beside the first electrode region and the second electrode region do not reciprocally influence one another.

An information item is often stored by means of Fowler-Nordheim tunneling electrons in the case of a floating gate electrode. In the case of an electrically insulating layer sequence, by contrast, information is stored by means of accelerated (the so-called "hot") channel electrons. Lower voltages are required for generating accelerated channel electrons than for generating Fowler-Nordheim tunneling electrons. According to the invention, information is stored in an electrically insulating layer sequence, as a result of which lower voltages than in the case of a floating gate electrode are required both for programming and for erasure of the memory transistors. Consequently, the formation of memory sections in an electrically insulating layer sequence also enables a further increase in the storage density.

The transistor arrangement thus has the advantage that the vertical transistor enables a space-saving arrangement, that is to say a high storage density, and stable operability in electronic components.

A further aspect of the invention is in the fact that, in the vertical transistor, it is possible to form a sufficiently long channel between the first electrode region and the second electrode region. This prevents a punch-through of the current flow between the first electrode region and the second electrode region during programming of the transistor arrangement, without the occurrence of disadvantageous effects for the storage density on account of the high one-dimensional extent of the channel. This is due to the fact that a transistor with a vertical conductive channel has an area requirement on the surface of the arrangement which is independent of the length of the channel. Consequently, the transistor arrangement of the invention provides an arrangement in which a high storage density and stable operability are combined.

The storage of a quantity of data of two bits in the vertical transistor is effected by means of the electrically insulating layer sequence which extends between the first electrode region and the second electrode region along the channel region. The electrically insulating layer sequence preferably has a layer sequence comprising a first oxide layer, a nitride layer and a second oxide layer. Consequently, the nitride layer is surrounded on both sides by an oxide layer in each case. Such a layer sequence is referred to as an ONO layer sequence. Usually, silicon dioxide ($SiO_2$) is used as material for the two oxide layers and silicon nitride ($Si_3N_4$) is used as material for the nitride layer. A first bit in the form of charge carriers can be stored in a section of the nitride layer of the ONO layer sequence essentially between the first electrode region, the channel region and the gate region. In a manner spatially separate and electrically decoupled therefrom, a second bit in the form of charge carriers can be stored in another section of the nitride layer of the ONO layer sequence which is arranged essentially between the second electrode region, the channel region and the gate region. Consequently, two bits can be stored in the vertical transistor of the transistor arrangement of the invention.

A binary information item of two bits can be stored in the nitride layer of the ONO layer sequence of a vertical transistor according to the invention, as is described below. If charge carriers are stored in one of the above-described sections of the ONO layer sequence, then this can be interpreted as binary information with the first logic value "1". By contrast, if no charge carriers are stored, then this can be interpreted as binary information with the second logic value "0". The first logic value "1" is stored by injection of accelerated ("hot") charge carriers into the respective memory section of the nitride layer.

Preferably, in the transistor arrangement, the channel region is p-doped and the two electrode regions are $n^+$-doped. "$n^+$" designates a doping with n-type doping atoms having a particularly large particle density, so that an $n^+$-doped region has particularly low resistance. Depending on which voltages are applied between the two electrode regions, the first electrode region becomes a source region and the second electrode region becomes a drain region, or the first electrode region becomes a drain region and the second electrode region becomes a source region.

In order to form memory arrangements having a plurality of memory transistors, the transistor arrangement according to the invention preferably has a plurality of vertical transistors which are arranged one beside the other in the substrate. In particular, such a transistor arrangement enables sufficiently short signal propagation times for programming and read-out of the transistor arrangement.

Preferably, in a transistor arrangement having a plurality of vertical transistors, an electrically insulating region, by which the first electrode region and/or the second electrode region is/are at least partly surrounded, decouples the first electrode region and/or the second electrode region from its/their surroundings with the exception of the channel region and the electrically insulating layer sequence. This prevents a punch-through of the current flow from an electrode region of a vertical transistor to the corresponding electrode region of an adjacent vertical transistor on account of space charge zones. Such space charge zones always form under applied voltage both around the first electrode region and around the second electrode region of a vertical transistor.

The fact that an electrode region is partly surrounded by an electrically insulating medium, for example a silicon dioxide layer, makes it possible to prevent undesired "crosstalk" between this electrode region and a corresponding electrode region of an adjacent vertical transistor. In order to avoid tunneling currents, the layer thickness of the electrically insulating medium is to be chosen to be sufficiently large. Consequently, by means of a suitably provided electrically insulating region, it is possible to avoid a "crosstalk" between different bit lines, that is to say between an electrode region of one vertical transistor and a corresponding electrode region of another, adjacent vertical transistor.

The memory arrangement in accordance with the configuration presented above thus has the advantage that the at least partial encapsulation of the electrode regions of the vertical transistors enables a space-saving arrangement, that is to say a high storage density, and stable operability. In particular, sufficiently high voltages for programming the arrangement can be applied to such a memory arrangement without the occurrence of disturbing effects such as parasitic current flows.

In order to achieve a further shortening of the signal propagation times in a memory arrangement having a plurality of vertical transistors, in accordance with a further configuration of the invention, the first electrode regions of all of the vertical transistors of the memory arrangement are electrically coupled to one another. Consequently, a common electrode region is formed for all the vertical transistors of the memory arrangement. This common electrode region is known under the terms "common source" or, alternatively, "common drain".

Furthermore, in the transistor arrangement, the gate region can be at least partly surrounded by an electrically insulating region in an asymmetrical manner in such a way that the gate region of a vertical transistor is electrically decoupled from adjacent vertical transistors. "In an asymmetrical manner" means for example that the electrically insulating region is provided only at one sidewall of the trench and thus isolates the sidewall of the trench from the gate region. In this way, it is also possible to prevent an undesirable electrical coupling between the gate region of a first vertical transistor of the transistor arrangement and the channel region of a second vertical transistor of the transistor arrangement. If the electrically insulating region is provided in such a way that it at least partly surrounds the gate region of a vertical transistor, it is ensured that, at further channel regions which are not coupled to the gate region considered, the properties of the vertical transistor coupled to the further channel region are not influenced on account of a voltage applied to the gate region.

A method for operating a transistor arrangement as a data memory is explained below, by means of which it is possible to operate the above-described transistor arrangement as a memory cell. The transistor arrangement of the invention can be used as an EEPROM (Electrically Erasable and Programmable Read-Only Memory) with a high storage density.

In accordance with the method for operating a transistor arrangement as a data memory, firstly a first data memory is formed from the section of the electrically insulating layer sequence which is assigned to the first electrode region. A second data memory is analogously formed from the section of the electrically insulating layer sequence which is assigned to the second electrode region. Finally, a bit can in each case be stored, read out or erased in the two data memories.

In principle, a quantity of data of two bits can be stored in the vertical transistor of the transistor arrangement by charge carriers being introduced into the two memory sections of the nitride layer of the ONO layer sequence which adjoin the electrode regions. Clearly, charge carriers can be injected in that section of the nitride layer which adjoins a selected electrode region by the channel between the first electrode region and the second electrode region being made electrically conductive by means of the application of a sufficiently high voltage to the gate region and, furthermore, a sufficiently high voltage being applied to the selected electrode region. As a result, electrons are conducted and accelerated from the non-selected electrode region along the conductive channel to the selected electrode region, the electrons tunneling, in a vicinity of the selected electrode region, through one of the oxide layers of the ONO layer sequence onto the nitride layer of the ONO layer sequence and permanently remaining there.

Since the nitride layer is electrically insulating, charge carrier balancing is not effected along the nitride layer. Consequently, the electrons are fixed at the nitride layer in the vicinity of the selected electrode region.

Analogously to the above description and independently of the electrons localized at the nitride layer in the vicinity of the selected electrode region, charge carriers can be permanently fixed at the nitride layer in the vicinity of the initially non-selected electrode region by means of the application of a sufficiently high voltage to the gate region and the simultaneous application of a sufficiently high voltage to the initially non-selected electrode region. In particular, the charge carriers in the nitride layer in the vicinity of the selected electrode region and in the vicinity of the initially non-selected electrode region are essentially independent of one another. This is due to the fact that charge carrier transport or charge carrier balancing cannot be effected along the electrically insulating nitride layer.

A bit is stored in one of the two data memories by a first storage voltage being applied to the first electrode region or the second electrode region and, simultaneously, a second storage voltage being applied to the gate region. The two storage voltages are to be chosen with a suitable magnitude and with a suitable sign. In this case, the second storage voltage is to be chosen such that its magnitude is greater than that of the first storage voltage.

The method for operating a transistor arrangement as a data memory provides a method by means of which the information stored in the two data memories in the nitride layer of the ONO layer sequence can be read out.

A bit is read out from one of the two data memories by a first read-out voltage being applied to the gate region and, simultaneously, a second read-out voltage being applied to the first electrode region or the second electrode region. In this case, the two read-out voltages are to be chosen suitably according to magnitude and sign. In particular, the two read-out voltages are to be chosen to be small enough to preclude a tunneling current of electrons to or from the nitride layer. In this case, the second read-out voltage may be less than or greater than the first read-out voltage.

In order to read out the binary information stored in the nitride layer near the second electrode region, a first read-out voltage is applied to the gate region in order to make the channel between the two electrode regions conductive. Furthermore, a second read-out voltage is applied to the second electrode region, as a result of which a flow of electrons from the first electrode region to the second electrode region is generated. This current flow is determined by means of the conductivity of the arrangement. The conductivity is characteristically determined on account of the charge carriers localized in the nitride layer near the second electrode region. The characteristic of the current flow makes it possible to ascertain whether charge carriers are fixed in the nitride layer near the second electrode region, so that the memory has the first logic value "1", or whether no charge carriers are fixed in the nitride layer near the second electrode region, so that the memory has the second logic value "0". In an analogous manner, the binary information in the nitride layer near the first electrode region can be read out by a first read-out voltage being applied to the gate region, in order to make the channel between the two electrode regions conductive, and by, simultaneously, a second read-out voltage being applied to the first electrode region, so that a flow of electrons from the second electrode region to the first electrode region is generated. The current characteristic again permits the conclusion as to whether charge carriers are fixed in the nitride layer near the first electrode region, so that the memory has the first logic value "1", or whether no charge carriers are fixed in the nitride layer near the first electrode region, so that the memory has the second logic value "0".

The method for operating a transistor arrangement as a data memory furthermore provides a method by means of which the information stored in the data memories can be erased. The term "erasure" denotes a resetting of all the binary memories to a value logic "0", that is to say that the charge carriers that are possibly localized in the nitride layer of the ONO layer sequence of a vertical transistor are removed as a result of the erasure. The removal of the charge carriers is realized by injection of so-called "hot" holes into the ONO layer sequence, the injected, positively charged holes recombining with the negatively charged electrons and, consequently, a net charge no longer being stored in the ONO layer sequence.

Bits are erased in the two data memories by a first erase voltage being applied to the first electrode region, a second erase voltage being applied to the second electrode region and a third erase voltage being applied to the gate region, simultaneously. In this case, the third erase voltage is to be chosen in such a way that it is significantly lower than the first erase voltage and also significantly lower than the second erase voltage. In this case, the first erase voltage and the second erase voltage may have the same absolute value.

By virtue of a sufficiently high third erase voltage of negative sign being applied to the gate region and by virtue of in each case a sufficiently high first and second erase voltage, respectively, with positive sign being applied to the first electrode region and the second electrode region, respectively, holes, that is to say positively charged charge carriers, are accelerated along the conductive channel, so that the "hot" holes tunnel through the oxide layer onto the nitride layer of the ONO layer sequence and recombine with the electrons localized there. In those data memories in which charge carriers were localized before the erase operation and, consequently, a binary information item with a first value logic "1" was impressed, the binary information is now reset to a second value logic "0" after the charge balancing.

The method according to the invention for operating a transistor arrangement as a data memory provides a method which makes it possible to store, to read and to erase two bits in each transistor of the transistor arrangement of the invention.

If the transistor arrangement is operated as a memory arrangement, a plurality of vertical transistors are preferably arranged one beside the other. Furthermore, the first electrode regions of all the vertical transistors are preferably electrically coupled to one another and, consequently, a "common source" region or a "common drain" region is formed. This makes it possible to accelerate the signal propagation times and thus the storage, read and erase processes in the memory arrangement.

A bit is stored in the first data memory of a specific vertical transistor of the memory arrangement with coupled first electrode regions by, in the specific vertical transistor, a first storage voltage being applied to the second electrode region and, simultaneously, a second storage voltage being applied to the gate region. As an alternative, a bit is stored in the second data memory of a specific vertical transistor of the memory arrangement with coupled first electrode regions by a first storage voltage being applied to the first electrode region and, simultaneously in the specific vertical transistor, a second storage voltage being applied to the gate region. The two storage voltages are to be chosen with a suitable magnitude and with a suitable sign. In this case, the second storage voltage is to be chosen in such a way that its magnitude is greater than that of the first storage voltage.

A bit is read out from the first data memory of a specific vertical transistor of the memory arrangement with coupled first electrode regions by a first read-out voltage being applied to the first electrode regions and, simultaneously in the specific vertical transistor, a second read-out voltage being applied to the gate region. By contrast, a bit is read out from the second data memory of a specific vertical transistor of the memory arrangement with coupled first electrode regions by a first read-out voltage being applied to the second electrode regions and, simultaneously in the specific vertical transistor, a second read-out voltage being applied to the gate region. The two read-out voltages are to be chosen with a suitable magnitude and with a suitable sign. In this case, the second read-out voltage may be greater than or less than the first read-out voltage.

Finally, bits are erased in the two data memories of a specific vertical transistor of the memory arrangement with coupled first electrode regions by a first erase voltage being applied to the first electrode regions, a second erase voltage being applied to the second electrode regions and a third erase voltage being applied to the gate regions, simultaneously. The erase voltages are to be chosen with a suitable magnitude and with a suitable sign. In this case, the third erase voltage is to be chosen in such a way that it is significantly lower than the first erase voltage and also significantly lower than the second erase voltage. The third erase voltage is preferably chosen to be negative. In this case, the first erase voltage and the second erase voltage may have the same absolute value.

Furthermore, the invention provides a method for fabricating a transistor arrangement according to the invention (in accordance with the above description). In accordance with the method, firstly a layer arrangement is formed from a substrate, a channel layer, an electrode layer and a first electrical insulation layer. A trench is then introduced into the layer arrangement, the trench extending right into the channel layer and, in the process, forming a channel region from the channel layer and a first electrode region from the electrode layer. Following this a second electrical insulation layer is formed on the inner area of the trench, and the second electrical insulation layer is removed again from a region of the inner area in a lateral upper section of the inner area of the trench. Subsequently, a second electrode region is formed in the trench, the second electrode region being formed on the second electrical insulation layer with the exception of a region in which the second electrode region is coupled to the channel region. Now, an electrically insulating layer sequence is applied. Finally, a gate region is formed on the electrically insulating layer sequence.

In accordance with another method, firstly a layer arrangement is formed from a substrate, a first electrode region, a channel layer and an electrode layer. A trench is then introduced into the layer arrangement, the trench extending as far as the first electrode region and, in the process, forming a channel region from the channel layer and a second electrode region from the electrode layer. Afterward, an electrically insulating layer sequence is formed above the first electrode region and the second electrode region and laterally at the channel region. Finally, a gate region is formed on the electrically insulating layer sequence.

In this case, the individual method steps are carried out using known methods such as photolithography, vapor phase epitaxy, cathode sputtering and other methods.

The following materials are preferably used in the fabrication of the transistor arrangement of the invention: the channel region is fabricated from a p-doped semiconductor material. The second electrode region is fabricated from an $n^+$-doped semiconductor material. The first electrically insulating region is fabricated from silicon nitride ($Si_3N_4$). The second electrically insulating region is fabricated from silicon dioxide ($SiO_2$). The second electrode region is fabricated from an $n^+$-doped semiconductor material. The electrically insulating layer sequence is fabricated from a layer sequence comprising a first oxide layer, a nitride layer and a second oxide layer (ONO layer sequence). The gate region is fabricated from an n-doped semiconductor material. And the first electrode region and/or the gate region are fabricated from polysilicon, that is to say polycrystalline silicon.

Functionally, the first electrically insulating region and the second electrically insulating region serve for forming the above-described electrically insulating region, by which the first electrode region and/or the second electrode region is/are at least partly surrounded, so that the first electrode region and/or the second electrode region is/are electrically decoupled from its/their surroundings with the exception of the associated channel region and the electrically insulating layer sequence. The gate region can also be at least partly surrounded by the electrically insulating region, which is formed by the first electrically insulating region and the second electrically insulating region, so that the gate region is coupled only with the associated channel region only through the electrically insulating layer sequence, whereas the gate region is electrically decoupled from further adjacent channel regions. Although the first electrically insulating region and the second electrically insulating region are not necessarily fabricated from the same material, they can nonetheless both be fabricated from silicon dioxide ($SiO_2$), for example.

BRIEF DESCRIPTION OF THE DRAWINGS

Exemplary embodiments of the invention are illustrated in the figures and are explained in more detail below. In this case, identical reference symbols designate identical components.

FIG. 3 shows a cross section through a transistor arrangement in accordance with a second exemplary embodiment of the invention with a plurality of vertical transistors, FIG. 4A shows a cross section of a layer arrangement after a first portion of a method for fabricating a transistor arrangement with a plurality of vertical transistors, according to an embodiment of the invention, FIG. 4B shows a cross section of a layer arrangement after a second portion of a method for fabricating a transistor arrangement with a plurality of vertical transistors, according to an embodiment of the invention, FIG. 4C shows a cross section of a layer arrangement after a third portion of a method for fabricating a transistor arrangement with a plurality of vertical transistors, according to an embodiment of the invention, FIG. 4D shows a cross section of a layer arrangement after a fourth portion of a method for fabricating a transistor arrangement with a plurality of vertical transistors, according to an embodiment of the invention.

DETAILED DESCRIPTION

Figure 1:
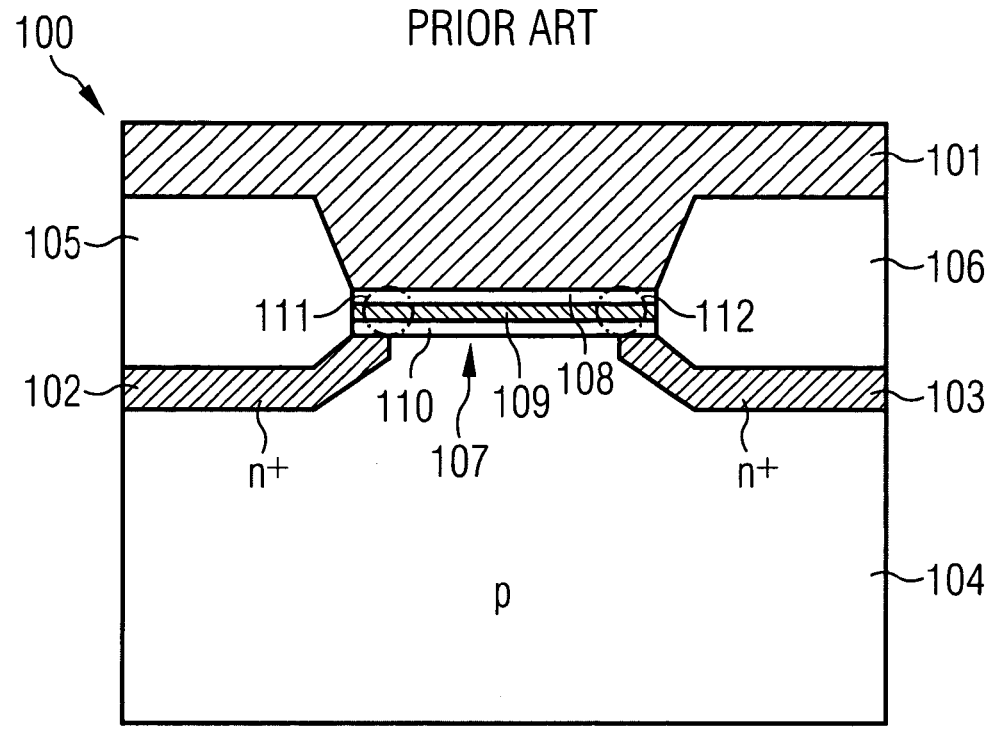
FIG. 1 shows a 2-bit memory transistor in accordance with the prior art.
Figure 2:
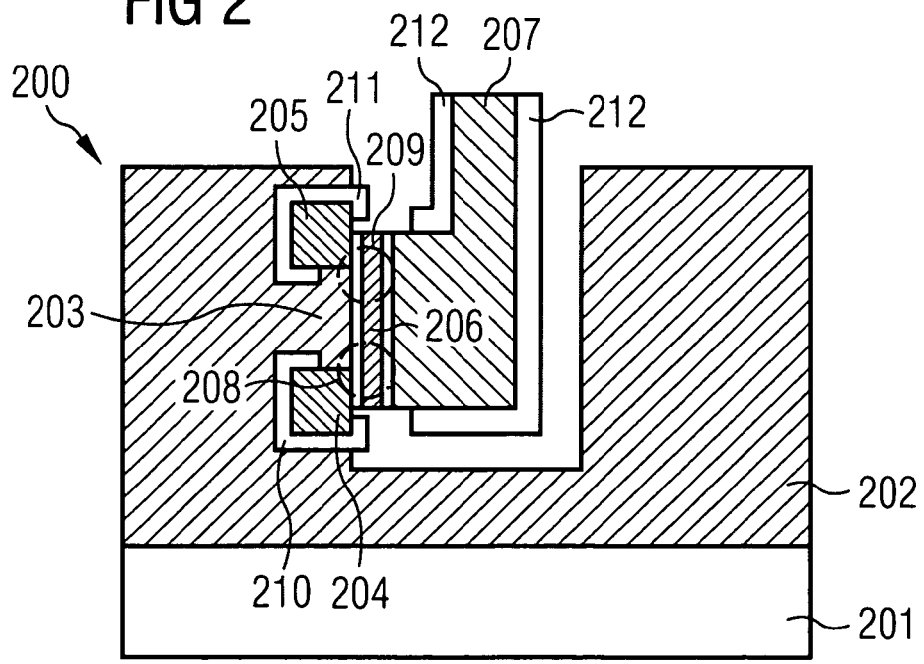
FIG. 2 shows a diagrammatic view of a transistor arrangement in accordance with a first exemplary embodiment of the invention with a vertical transistor.

FIG. 2 shows a diagrammatic view of a transistor arrangement 200 in accordance with a first exemplary embodiment of the invention with a vertical transistor.

The transistor arrangement 200 has a substrate 201 and a channel layer 202—applied on the substrate 201—with a trench introduced therein, so that a channel region 203 is formed beside the trench. A vertical transistor is formed at the edge of the trench. The vertical transistor has a first electrode region 204 and a second electrode region 205, which are coupled to the channel region 203. In accordance with this exemplary embodiment, the first electrode region 204 is the source region and the second electrode region 205 is the drain region. Furthermore, the vertical transistor has an electrically insulating layer sequence 206, which extends between the first electrode region 204 and the second electrode region 205 along the channel region 203.

Moreover, the vertical transistor has an electrically conductive gate region 207 arranged on the electrically insulating layer sequence 206 in such a way that an electrically conductive channel can be formed in the channel region 203 between the first electrode region 204, the second electrode region 205 and the electrically insulating layer sequence 206. The vertical transistor has an electrically insulating region 210 and 211, respectively, by which the first electrode region 204 and the second electrode region 205 are at least partly surrounded, respectively, so that the first electrode region 204 and the second electrode region 205, respectively, are electrically decoupled from their surroundings with the exception of the channel region 203 and the electrically insulating layer sequence 206. The electrically insulating region 210 and 211, respectively, is optional in this case. The electrically insulating layer sequence 206 runs at least partly perpendicularly to the surface of the substrate 200.

Furthermore, in accordance with FIG. 2, the gate region 207 is at least partly surrounded by an electrically insulating region 212. The electrically insulating region 212 is also optional.

The method of operation of the transistor arrangement 200 illustrated in FIG. 2 is described below. What is of importance for the functionality is, in particular, the aspect that the electrically insulating layer sequence 206 is oriented essentially vertically with respect to the surface of the substrate 201. The at least partial electrically insulating encapsulation 210, 211, 212 of the first electrode region 204, of the second electrode region 205 and of the gate region 207 enables an arrangement of a plurality of vertical transistors according to the invention in a memory arrangement having a high storage density, without adjacent vertical transistors in the memory arrangement having a reciprocal disturbing influence on one another. This prevents a punch-through of the current flow between adjacent bit and word lines, respectively, that is to say between the electrode regions 204, 205 and the gate regions 207, respectively, of two adjacent vertical transistors in a memory arrangement.

The fact that the electrically insulating layer sequence 206 is arranged essentially perpendicularly to the surface of the transistor arrangement 200 makes it possible to form the electrically insulating layer sequence 206 with a sufficiently long length without increasing the area requirement of the vertical transistors in a memory arrangement on the surface of the memory arrangement. An electrically insulating layer sequence 206 extended to a sufficient length merely increases the depth of the trench, whereas the storage density (number of vertical transistors per surface of the memory arrangement) is not reduced. A sufficiently long electrically conductive layer sequence 206 serves to prevent a punch-through of the current flow between the first electrode region 204 and the second electrode region 205 in the event of high voltages applied to the gate region 207 and the first electrode region 204 or the second electrode region 205.

The parasitic current flows described can occur if the vertical transistor of the transistor arrangement 200, which can store a quantity of data of two bits, is programmed, read or erased, as described further below. The way in which a quantity of data of two bits can be stored in the vertical transistor is explained below with reference to FIG. 2. The construction of the electrically insulating layer sequence 206 is crucial for this. In accordance with the first exemplary embodiment of the invention, the electrically insulating layer sequence 206 is provided as an ONO layer sequence. The ONO layer sequence has a nitride layer made of silicon nitride ($Si_3N_4$) arranged between two oxide layers made of silicon dioxide ($SiO_2$).

A quantity of data of one bit can in each case be stored in two mutually spatially separate and electrically decoupled sections 208, 209 of the nitride layer of the electrically insulating layer sequence 206 which are situated between the channel region 203, the gate region 207 and the first electrode region 204 and the second electrode region 205, respectively. The memory sections 208, 209 are visually emphasized by means of dashed circles in FIG. 2 and are arranged on the source side and on the drain side, respectively. A binary information item with a logic value "1" or "0" can be stored in the sections 208, 209 by electronic charge carriers being able to tunnel into the two memory sections 208, 209 on account of the application of suitable voltages to the first electrode region 204, the second electrode region 205 and the gate region 207, respectively. If electronic charge carriers are permanently stored in one of the two memory sections 208, 209, a first logic value "1" is present in the corresponding memory section 208 or 209, otherwise a second logic value "0".

A transistor arrangement 300 in accordance with a second exemplary embodiment of the invention with a plurality of vertical transistors is described below with reference to FIG. 3.

The transistor arrangement 300 has a substrate 301 and a channel layer 302—applied on the substrate 301—with a plurality of trenches introduced therein, so that channel regions 303 are formed between two trenches in each case. Furthermore, the transistor arrangement 300 contains a respective vertical transistor in each region formed by a trench and by a channel region 303. Each of the vertical transistors has a first electrode region 304 and a second electrode region 305, which are coupled to exactly one of the channel regions 303. Furthermore, each vertical transistor contains an electrically insulating layer sequence 306, which extends partly between the first electrode region 304 and the second electrode region 305 along the channel region 303.

An electrically conductive gate region 307 is arranged on the electrically insulating layer sequence 306 in such a way that an electrically conductive channel can be formed in the coupling region between the first electrode region 304 and the second electrode region 305 in the channel region 303 beside the electrically insulating layer sequence 306. Furthermore, each vertical transistor has an electrically insulating region 308, 309, by which the first electrode region 304, the second electrode region 305 and the gate region 307 are partly surrounded, so that the first electrode region 304, the second electrode region 305 and the gate region 307 is/are electrically decoupled from their surroundings with the exception of the associated channel region 303 and/or the associated electrically insulating layer sequence 306. The electrically insulating layer sequence 306 runs at least partly perpendicularly to the surface of the transistor arrangement 300.

Furthermore, FIG. 3 shows the two memory regions 310, 311, in the electrically insulating layer sequence 306, which regions are visually emphasized in the form of dashed circles. A quantity of data of one bit can in each case be stored in each memory region 310, 311.

In accordance with the second exemplary embodiment of the invention as illustrated in FIG. 3, the following materials can preferably be used for the diverse constituent parts of the transistor arrangement 300: the substrate 301 and the channel layer 302 are fabricated from a p-doped semiconductor material such as silicon. The first electrode region 304 is fabricated from an $n^+$-doped semiconductor material such as polycrystalline silicon, a section of the first electrode region 304 that is coupled to the channel region 303 preferably being fabricated from an n-doped semiconductor material. This n-doped section is illustrated in FIG. 3 by means of a dashed line separate from the $n^+$-doped section of the first electrode region 304. The second electrode region 305 is also fabricated from $n^+$-doped semiconductor material such as silicon.

As already described above, the electrically insulating layer sequence 306 has, in a fixed order, a first oxide layer made of silicon dioxide ($SiO_2$), a nitride layer made of silicon nitride ($Si_3N_4$) and a second oxide layer made of silicon dioxide ($SiO_2$). In accordance with the second exemplary embodiment of the invention as shown in FIG. 3, the electrically insulating layer sequence 306 extends without interruption along the entire transistor arrangement 300. This is a consequence of the fabrication method by means of which the second exemplary embodiment of the invention as shown in FIG. 3 can be fabricated and which is explained in detail further below.

The gate region 307 is fabricated from n-doped semiconductor material such as polycrystalline silicon. The electrically insulating regions 308, 309, by means of which, according to the invention, the first electrode region 304, the second electrode region 305 and the gate region 307 are at least partly electrically decoupled from their surroundings, are realized by a layer made of silicon nitride ($Si_3N_4$) and a layer made of silicon dioxide ($SiO_2$). The vertical upper section of the electrically insulating region 309, which section is made sufficiently thick, has the effect that a "vertical ONO transistor" is formed only at one of two sidewalls of a trench. Consequently, "hot" charge carriers, which are produced for example at the second electrode region 305 of a vertical transistor, cannot influence the properties of a vertical transistor arranged at the opposite sidewall.

A method for operating a transistor arrangement 300 as a data memory is described below with reference to FIG. 3 and Table 1.

An explanation is given of an exemplary embodiment of a method for operating a transistor arrangement as a data memory. The method is described using the example of the transistor arrangement 300 shown in FIG. 3. In accordance with the method, the memory regions 310 and 311, in which the first electrode region 304 and, respectively, the second electrode region 305, on the one hand, and the channel region 303 and also the electrically insulating layer sequence 306, on the other hand, are coupled, form separate data memories in which a bit can in each case be stored, read out or erased.

TABLE 1

Voltages to be applied to the first electrode region 304, the second electrode region 305 and the gate region 307, respectively, in the event of storage, read-out and erasure, respectively, in the respective memory region 310, 311 of a vertical transistor of the transistor arrangement 300.

| Voltage | Storage | | Read-out | | Erasure |
| --- | --- | --- | --- | --- | --- |
| | Memory region 311 | Memory region 310 | Memory region 311 | Memory region 310 | Memory regions 310, 311 |
| First electrode region 304 | 0 V | 5 V | 1.2 V | 0 V | 5 V |
| Second electrode region 305 | 5 V | 0 V | 0 V | 1.2 V | 5 V |
| Gate region 307 | 10 V | 10 V | 2 V | 2 V | −5 V |

With reference to Table 1, firstly an explanation is given of a method by means of which two bits can be stored in the transistor arrangement 300. In order to store a quantity of data of one bit with a first logic value "1" in the memory region 311, a first programming voltage of 5 V is applied to the second electrode region 305 and, simultaneously, a second programming voltage of 10 V is applied to the gate region 307. No voltage is applied to the first electrode region 304. The second programming voltage applied to the gate region 307 causes an electrically conductive channel to form between the first electrode region 304 and the second electrode region 305 along the electrically insulating layer sequence 306. The first programming voltage of 5 V applied to the second electrode region 305 produces an electron flow between the first electrode region 304 and the second electrode region 305, on account of which accelerated electrons tunnel to the nitride layer of the electrically insulating layer sequence 306 in the memory region 311 and permanently remain there. If no electrons are permanently localized in the memory region 311, then this corresponds to a second logic value "0".

In order to store a quantity of data of one bit with a first logic value "1" in the memory region 310, a first programming voltage of 5 V is applied to the first electrode region 304 and, simultaneously, a second programming voltage of 10 V is applied to the gate region 307. No voltage is applied to the second electrode region 305. The second programming voltage applied to the gate region 307 causes an electrically conductive channel to form between the first electrode region 304 and the second electrode region 305 along the electrically insulating layer sequence 306. The first programming voltage of 5 V applied to the first electrode region 304 produces an electron flow between the second electrode region 305 and the first electrode region 304, on account of which electrons tunnel to the nitride layer of the electrically insulating layer sequence 306 in the memory region 310 and permanently remain there. If no electrons are permanently localized in the memory region 310, then this corresponds to a second logic value "0".

Referring once again to Table 1, a description is given below of a method by means of which the quantity of data of two bits that is stored in the transistor arrangement 300 is read out. In order to read out the bit stored in the memory region 311 near the second electrode region 305, a first read-out voltage of 1.2 V is applied to the first electrode region 304 and, simultaneously, a second read-out voltage of 2 V is applied to the gate region 307. No voltage is applied to the second electrode region 305. If charge carriers are impressed in the memory region 311 (first logic value "1"), then the conductivity near the memory region 311 is a different conductivity than if no charge carriers are impressed in the memory section 311 (second logic value "0"). From the current between the first electrode region 304 and the second electrode region 305 along the conductive channel, it is consequently possible to read, on account of the applied voltage signals, whether the binary information stored in the memory region 311 has a first logic value "1" or a second logic value "0". The applied voltage signals are chosen to be small enough that tunneling currents to, from or via the electrically insulating layer sequence 306 do not occur.

In order to read out the bit stored in the memory region 310 near the first electrode region 304, a first read-out voltage of 1.2 V is applied to the second electrode region 305 and, simultaneously, a second read-out voltage of 2 V is applied to the gate region 307. No voltage is applied to the first electrode region 304. If charge carriers are impressed in the memory region 310 (first logic value "1"), then the conductivity near the memory region 310 is a different conductivity than if no charge carriers are impressed in the memory region 310 (second logic value "0"). From the current between the second electrode region 305 and the first electrode region 304 along the conductive channel, it is consequently possible to read, on account of the applied voltage signals, whether the binary information stored in the memory region 310 has a first logic value "1" or a second logic value "0". The applied voltage signals are chosen to be small enough that tunneling currents to, from or via the electrically insulating layer sequence 306 do not occur.

Furthermore, the exemplary embodiment of the method according to the invention for operating a transistor arrangement as a data memory has a method by means of which the quantity of data of two bits which can be stored in each of the vertical transistors of the transistor arrangement 300 can be erased. With reference to Table 1, for this purpose, a first erase voltage of 5 V is applied to the first electrode region 304, a second erase voltage of 5 V is applied to the second electrode region 305, and a third erase voltage of −5 V is applied to the gate region 307. On account of these voltage signals, holes, that is to say positive charge carriers, are accelerated and tunnel into the memory regions 310, 311 of the electrically insulating layer sequence 306 in which electronic charge carriers were localized. The positively charged holes and the negatively charged electrons recombine there to form a vanishing total charge. As a result, the electronic charge carriers which, before the erase operation, were permanently localized on the nitride layer in the memory regions 310, 311, in order to represent the first logic value "1", are removed from the electrically insulating layer sequence 306. Accordingly, after the erase operation, both bits stored in a vertical transistor of the transistor arrangement 300 are reset to the second logic value "0".

A preferred exemplary embodiment for a method according to the invention for fabricating a transistor arrangement 300 with a plurality of vertical transistors is explained below with reference to FIG. 4A, FIG. 4B, FIG. 4C, FIG. 4D, FIG. 4E and FIG. 4F.

A first portion of a method according to an embodiment of the invention is described with reference to FIG. 4A. The starting material used is a silicon substrate 401, on whose surface is formed a silicon dioxide layer (not shown in the drawing), if appropriate with a surface masking. This can be realized for example by oxidation and, if appropriate, patterning of the silicon surface.

By means of an implantation method, p-doping atoms are introduced into a surface region of the arrangement in order to form a p-doped channel layer 402 in the substrate 401. The remaining, untreated substrate is designated by the reference symbol 301.

In a further method step, the silicon dioxide layer or the silicon dioxide mask on the surface of the arrangement is etched by means of a suitable etching technique. In a further step, n-doping atoms are introduced into a surface section of the p-doped channel layer 402 by means of an implantation method, in order thus to form an $n^+$-doped, that is to say a heavily n-doped, second electrode layer 403.

In a further step, a silicon nitride layer 404, which is electrically insulating and serves as a passivation layer, is applied on the surface of the $n^{30}$-doped second electrode layer 403. The application of the silicon nitride layer 404 and all of the below-described method steps in which a material is applied on a surface are carried out using a standard method suitable for the respective individual case, such as, for example, vapor phase deposition (CVD), vapor deposition or cathode sputtering. The layer arrangement 400A, shown in FIG. 4A, results after the method steps described above have been carried out.

A second portion of a method according to an embodiment of the invention is described with reference to FIG. 4B.

Firstly, a plurality of trenches are formed in the layer arrangement 400A, which trenches are oriented essentially parallel to one another and, as shown in FIG. 4B, extend essentially perpendicularly through the entire silicon nitride layer 404 right into the channel layer 402. The trenches are preferably introduced into the channel layer 402 to a depth of about 0.3 μm.

The trenches can be introduced into the layer arrangement 400A by means of a photolithography method, for example. During the photolithography method, firstly a photoresist is applied on the surface of the layer arrangement 400A and then the surface is selectively exposed in accordance with the desired arrangement of the trenches, that is to say width and spacing of the trenches, by means of a suitable mask. Afterward, the photoresist is removed in the exposed surface sections by means of a suitable etching technique and, subsequently, first the uncovered regions of the silicon nitride layer 404 and then the $n^+$-doped second electrode layer 403 and the p-doped channel layer 402 are etched away. As a result, first electrically insulating regions 308 are formed from the silicon nitride layer 404, second electrode regions 305 are formed from the $n^+$-doped second electrode layer 403 and channel regions 303 are formed from the p-doped channel layer 402. The remaining region of the p-doped channel layer 402 is now designated by the reference symbol 302. The photoresist is subsequently removed on the nonexposed surface sections of the arrangement. In a further method step, the uncovered silicon surface sections in the trenches are oxidized to form silicon dioxide ($SiO_2$). As a result, a silicon dioxide layer 405 is formed in the trenches.

The layer arrangement 400B, shown in FIG. 4B, results from the method steps that have been carried out.

A third portion of a method according to an embodiment of the invention is described with reference to FIG. 4C.

A polysilicon layer made of polycrystalline silicon, which is $n^+$-doped and accordingly has a high electrical conductivity, is applied on the layer arrangement 400B. The polysilicon layer is then removed, by means of a suitable etching technique, from surface sections of the layer arrangement 400B which form the intermediate regions between the trenches. In other words, by means of the deposition operation and the etching operation on the layer arrangement 400B, in each of the trenches, a heavily $n^+$-doped first electrode layer 406 made of polysilicon is formed on the silicon dioxide layer 405. This results in the layer arrangement 400C illustrated in FIG. 4C.

A fourth portion of a method according to an embodiment of the invention is described with reference to FIG. 4D.

Proceeding from the layer arrangement 400C illustrated in FIG. 4C, a silicon dioxide layer is applied to the arrangement. This is realized using a suitable deposition method. The silicon dioxide layer is then partly removed by means of a photolithography method. As shown in FIG. 4D, the silicon dioxide layer is removed from the surface sections between the trenches and in each of the trenches in a left-hand section in accordance with FIG. 4D, so that a silicon dioxide wall 407 remains in a right-hand section of each trench in accordance with FIG. 4D. In accordance with a preferred exemplary embodiment, the thickness of the silicon dioxide wall 407 is about half the width of a trench. Furthermore, a part of the silicon dioxide layer 405 is preserved in a left-hand section of each trench in accordance with FIG. 4D in the interspace between the $n^+$-doped first electrode layer 406 and the channel region 303. The remaining part of the silicon dioxide layers 405 forms, together with the silicon dioxide walls 407, the second electrically insulating regions 309.

The removal of the silicon dioxide material in the manner described can be effected by means of a photolithography method, for example. Firstly a photoresist is applied on the surface of the layer arrangement 400C and the surface is exposed in accordance with the desired silicon dioxide patterning by means of a suitable mask. The photoresist is then removed in the exposed surface sections by means of a suitable etching technique and silicon dioxide material is subsequently removed by etching in accordance with the structure sought. In a further step, the photoresist is removed from the nonexposed surface sections of the arrangement and the layer arrangement 400D shown in FIG. 4D is thus obtained.

A fifth portion of a method according to an embodiment of the invention is described with reference to FIG. 4E.

A thin layer of undoped polycrystalline silicon is applied to the previous layer arrangement. By means of a suitable method, in a next method step, the applied layer is removed with the exception of a gap enclosed by a, in accordance with FIG. 4E, bottom left edge region of a trench with the $n^+$-doped first electrode layer 406 situated in said trench (cf. FIG. 4E). There remains an undoped first electrode layer 408 made of polysilicon, by means of which the $n^+$-doped first electrode layer 406 is coupled to the channel region 303. The undoped first electrode layer 408 forms, together with the n⁺-doped first electrode layer 406, the first electrode region 304. The method step described last is carried out by means of a suitable etching method, for example wet etching, in accordance with this exemplary embodiment. The layer arrangement 400E shown in FIG. 4E results.

A sixth portion of a method according to an embodiment of the invention is described with reference to FIG. 4F.

An electrically insulating layer sequence 306 is applied to the layer arrangement 400E. In this exemplary embodiment of the invention, the electrically insulating layer sequence 306 is an ONO layer sequence having a nitride layer made of silicon nitride ($Si_3N_4$) which is covered on both sides by a respective oxide layer made of silicon dioxide ($SiO_2$). In a further method step, n-doped polycrystalline silicon is applied to the electrically insulating layer sequence 306. The trenches still present before this method step are filled with this silicon material in order to form gate regions 307. The resulting plane surface is furthermore covered with an n-doped polycrystalline silicon layer 409. In order to produce a patterned polysilicon arrangement, a photoresist can be applied to the n-doped polycrystalline silicon layer 409, said photoresist can be patterned by means of a mask exposed in a photolithography method, and a structure for connecting the gate regions 307 can be etched into the n-doped polycrystalline silicon layer 409 in accordance with the mask. The photoresist is then removed in a further method step.

Figure 4E:
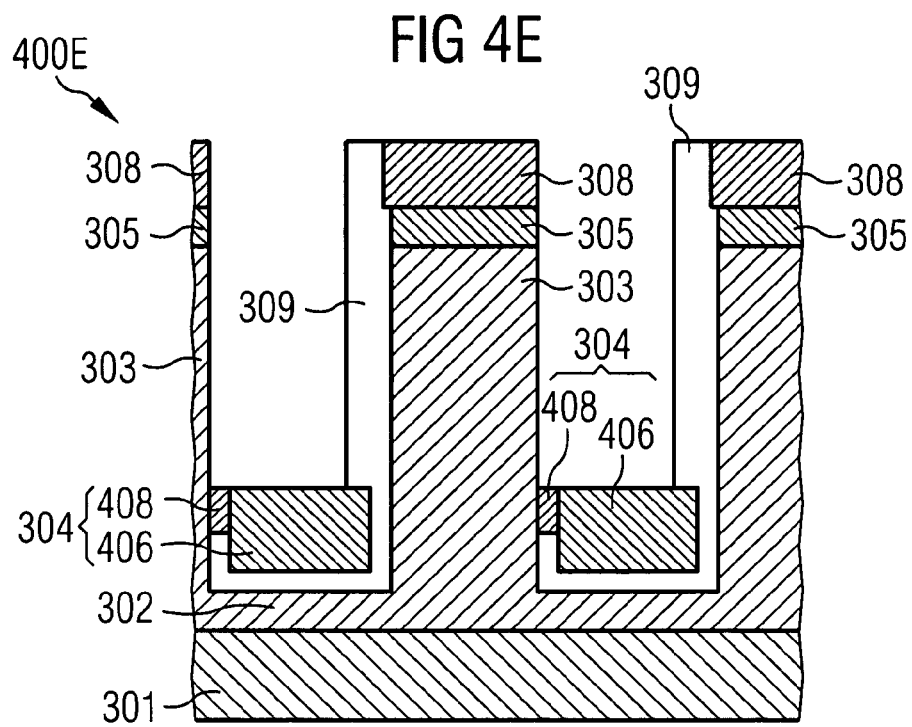
FIG. 4E shows a cross section of a layer arrangement after a fifth portion of a method for fabricating a transistor arrangement with a plurality of vertical transistors, according to an embodiment of the invention.
Figure 4F:
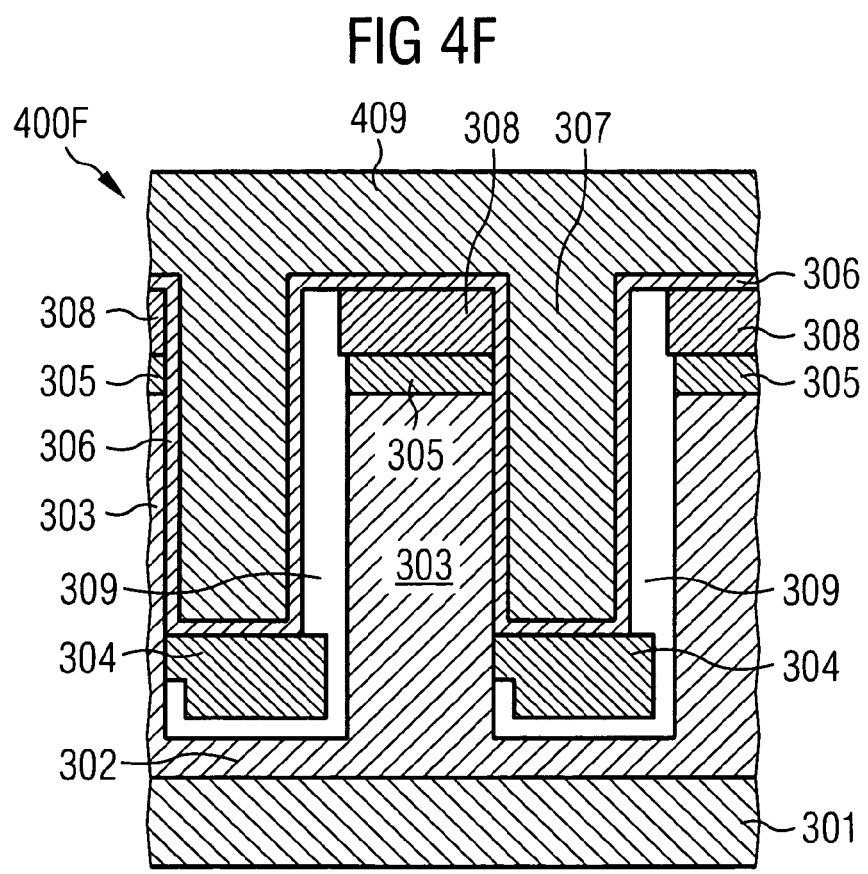
FIG. 4F shows a cross section of a layer arrangement after a sixth portion of a method for fabricating a transistor arrangement with a plurality of vertical transistors, according to an embodiment of the invention.

FIG. 4F shows the layer arrangement 400F which results after the method sections explained have been carried out. The layer arrangement obtained is suitable for being used as a transistor arrangement 300 in which, as described above, two bits can be stored, read and erased in each of the vertical transistors.

Figure 5:
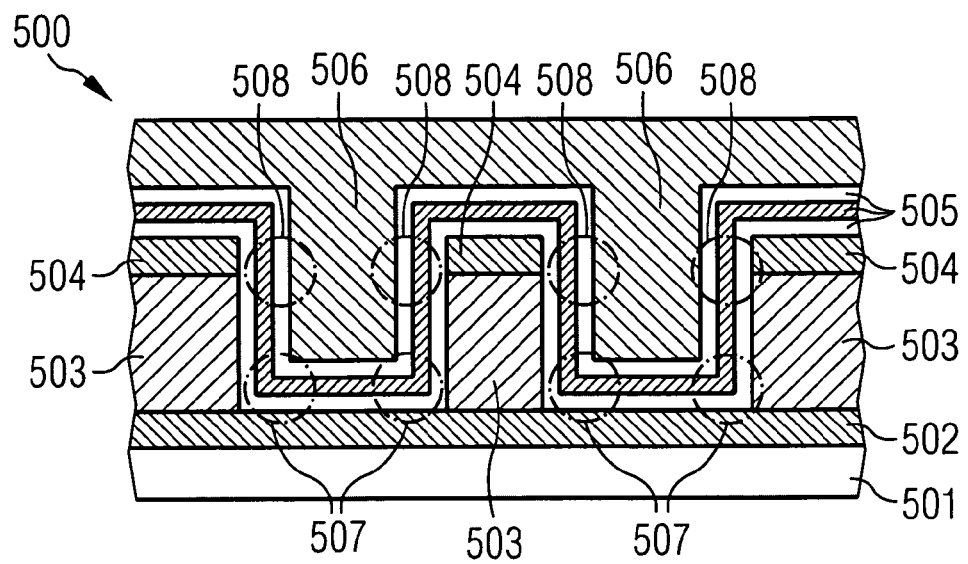
FIG. 5 shows a cross section through a transistor arrangement in accordance with a third exemplary embodiment of the invention with a plurality of vertical transistors.

FIG. 5 illustrates a transistor arrangement 500 in accordance with a third exemplary embodiment of the invention with a plurality of vertical transistors.

The transistor arrangement 500 has a substrate 501 and a first electrode region 502, which is the source region in accordance with this exemplary embodiment, situated on the substrate 501. A plurality of channel regions 503 are formed on the first electrode region 502. A second electrode region 504, which is the respective drain region in accordance with this exemplary embodiment, is arranged above each channel region 503. Furthermore, in the transistor arrangement 500, a vertical transistor is formed by the first electrode region 502 and also a respective channel region 503 and a second electrode region 504 arranged above the latter. Each of the vertical transistors is thus coupled to precisely one of the channel regions 503. In this case, the first electrode region 502 extends below all the vertical transistors. Consequently, in accordance with this exemplary embodiment, the first electrode region 502 clearly constitutes a common source region, which is also known as "common source". In each vertical transistor, the first electrode region 502 in each case forms a first electrode section. Consequently, the first electrode sections of all the vertical transistors have a uniform potential. This affords the advantage of a lower resistance in the first electrode region 502, thereby enabling a further shortening of the signal propagation times for storage, read-out and erasure of the data memories with the density of the vertical transistors in the transistor arrangement 500 remaining the same.

Furthermore, the transistor arrangement 500 contains an electrically insulating layer sequence 505 which covers all the uncovered regions of the first electrode region 502, of the channel regions 503 and of the second electrode regions 504. Consequently, the electrically insulating layer sequence 505 extends inter alia in each vertical transistor along the channel region 503 between the first electrode region 502 and the second electrode region 504. The electrically insulating layer sequence 505 thus runs at least partly perpendicularly to the surface of the transistor arrangement 500.

An electrically conductive gate region 506 is arranged on the electrically insulating layer sequence 505 in such a way that an electrically conductive channel can be formed in the coupling region of each vertical transistor between the first electrode region 502 and the second electrode region 504 in the channel region 503 beside the electrically insulating layer sequence 505.

Furthermore, FIG. 5 shows the two mutually spatially separate and electrically decoupled memory regions 507, 508 in the electrically insulating layer sequence 505, said memory regions being visually emphasized in the form of dashed circles. A quantity of data of one bit can in each case be stored in each memory region 507, 508.

In accordance with the third exemplary embodiment of the invention as illustrated in FIG. 5, the following materials are used for the diverse constituent parts of the transistor arrangement 500: the substrate 501 and the channel regions 503 are fabricated from a p-doped semiconductor material such as silicon. The first electrode region 502 and the second electrode regions 504 are fabricated from an n⁺-doped semiconductor material. The gate region 506 is fabricated from n-doped semiconductor material such as polycrystalline silicon.

As already described above, the electrically insulating layer sequence 505 has, in a fixed order, a first oxide layer made of silicon dioxide ($SiO_2$), a nitride layer made of silicon nitride ($Si_3N_4$), and a second oxide layer made of silicon dioxide ($SiO_2$). In accordance with the third exemplary embodiment of the invention as shown in FIG. 5, the electrically insulating layer sequence 505 extends without interruption along the entire transistor arrangement 500. This is a consequence of the fabrication method by means of which the third exemplary embodiment of the invention as shown in FIG. 5 can be fabricated and which is explained in detail further below.

A method for operating a transistor arrangement 500 with a plurality of vertical transistors as a data memory is described below with reference to FIG. 5 and Table 2.

TABLE 2

Voltages to be applied to the first electrode region 502, the selected and remaining second electrode regions 504 and the selected and remaining gate regions 506 during storage, read-out and erasure, respectively, in the respective memory region 507, 508 of a selected vertical transistor of the transistor arrangement 500.

| Voltage | Storage | | Read-out | | Erasure |
| --- | --- | --- | --- | --- | --- |
| | Sel. memory region 507 | Sel. memory region 508 | Sel. memory region 507 | Sel. memory region 508 | All memory regions 507, 508 |
| First electrode region 502 | 6 V | 0 V | 2 V | 0 V | 6 V |
| Sel. second electrode regions 504 | 0 V | 6 V | 0 V | 2 V | 6 V |

TABLE 2-continued

Voltages to be applied to the first electrode region 502, the selected and remaining second electrode regions 504 and the selected and remaining gate regions 506 during storage, read-out and erasure, respectively, in the respective memory region 507, 508 of a selected vertical transistor of the transistor arrangement 500.

| | Storage | | Read-out | | Erasure |
|---|---|---|---|---|---|
| Voltage | Sel. memory region 507 | Sel. memory region 508 | Sel. memory region 507 | Sel. memory region 508 | All memory regions 507, 508 |
| Rem. second electrode regions 504 | 6 V | 0 V | 0 V | 2 V | 0 V |
| Sel. gate regions 506 | 10 V | 10 V | 1.2 V | 0 V | −6 V |
| Rem. gate regions 506 | 0 V | 0 V | 0 V | 1.2 V | 0 V |

In accordance with the method, the memory regions 507 and 508, respectively, in which the first electrode region 502 and, respectively, the second electrode regions 504, on the one hand, and the channel regions 503 and also the electrically insulating layer sequence 505, on the other hand, are coupled, form separate data memories in which one bit in each case can be stored, read out or erased.

Firstly, a method by means of which two bits can be stored in a selected vertical transistor of the transistor arrangement 500 is explained with reference to Table 2. In order to store a quantity of data of one bit with a first logic value "1" in the memory region 507 of a selected vertical transistor, a first programming voltage of 6 V is applied to the first electrode region 502 and to the remaining, nonselected second electrode regions 504 and, simultaneously, a second programming voltage of 10 V is applied to the selected gate region 506. No voltage is applied to the selected second electrode region 504 and the remaining, nonselected gate regions 506. The second programming voltage applied to the selected gate region 506 causes an electrically conductive channel to be formed between the first electrode region 502 and the selected second electrode region 504 along the electrically insulating layer sequence 505. The first programming voltage of 6 V applied to the first electrode region 502 produces an electron flow between the selected second electrode region 504 and the first electrode region 502, on account of which accelerated electrons tunnel to the nitride layer of the electrically insulating layer sequence 505 into the memory region 507 and permanently remain there. If no electrons are permanently localized in the memory region 507, then this corresponds to a second logic value "0".

In order to store a quantity of data of one bit with a first logic value "1" in the memory region 508 of a selected vertical transistor, a first programming voltage of 6 V is applied to the selected second electrode region 504 and, simultaneously, a second programming voltage of 10 V is applied to the selected gate region 506. No voltage is applied to the first electrode region 502, the remaining, nonselected second electrode regions 504 and the remaining, nonselected gate regions 506. The second programming voltage applied to the selected gate region 506 causes an electrically conductive channel to be formed between the first electrode region 502 and the selected second electrode region 504 along the electrically insulating layer sequence 306. The first programming voltage of 6 V applied to the selected second electrode region 504 produces an electron flow between the first electrode region 502 and the selected second electrode region 504, on account of which electrons tunnel to the nitride layer of the electrically insulating layer sequence 505 into the memory region 508 and permanently remain there. If no electrons are permanently localized in the memory region 508, then this corresponds to a second logic value "0".

Referring to Table 2 again, a method is described below by means of which the quantity of data of two bits that is stored in a selected vertical transistor of the transistor arrangement 500 is read out. In order to read out the bit stored in the memory region 507 of a selected vertical transistor near the first electrode region 502, a first read-out voltage of 2 V is applied to the first electrode region 507 and, simultaneously, a second read-out voltage of 1.2 V is applied to the selected gate region 506. No voltage is applied to the second electrode regions 504 and the remaining, nonselected gate regions 506. If charge carriers are impressed in the memory region 507 (first logic value "1"), then the conductivity near the memory region 507 is a different conductivity than if no charge carriers are impressed in the memory section 507 (second logic value "0"). From the current between the first electrode region 502 and the selected second electrode region 504 along the conductive channel, it can thus be read, on account of the applied voltage signals, whether the binary information stored in the memory region 507 has a first logic value "1" or a second logic value "0". The applied voltage signals are chosen to be small enough that tunneling currents to, from or via the electrically insulating layer sequence 505 do not occur.

In order to read out the bit stored in the memory region 508 of a selected vertical transistor near the selected second electrode region 504, a first read-out voltage of 2 V is applied to all the second electrode regions 504 and, simultaneously, a second read-out voltage of 1.2 V is applied to the remaining, nonselected gate regions 506. No voltage is applied to the first electrode region 502 and the selected gate regions 506. If charge carriers are impressed in the memory region 508 (first logic value "1"), the conductivity near the memory region 508 is a different conductivity than if no charge carriers are impressed in the memory region 508 (second logic value "0"). From the current between a selected second electrode region 504 and the first electrode region 502 along the conductive channel, it can thus be read, on account of the applied voltage signals, whether the binary information stored in the memory region 508 has a first logic value "1" or a second logic value "0". The applied voltage signals are chosen to be small enough that tunneling currents to, from or via the electrically insulating layer sequence 505 do not occur.

A method by means of which the quantity of data of two bits which can be stored in a selected vertical transistor of the transistor arrangement 500 can be erased is described below with reference to Table 2. For this purpose, a first erase voltage of 6 V is applied to the first electrode region 502, a second erase voltage of 6 V is applied to the selected second electrode region 504 and a third erase voltage of −6 V is applied to the selected gate region 506. No voltage is applied to the remaining, nonselected second electrode regions 504 and the remaining, nonselected gate regions 506. On account of the voltage signals, holes, that is to say positive charge carriers, are accelerated and tunnel into the memory regions 507, 508 of the electrically insulating layer sequence 505 of the selected vertical transistor in which electronic charge carriers were localized. The positively charged holes and the negatively charged electrons recombine there to form a vanishing total charge. As a result, the electronic charge carriers which, before the erase operation, were permanently localized on the nitride layer in the memory regions 507, 508, in order to represent the first logic value "1", are removed from the electrically insulating layer sequence 505. Accordingly, after the erase operation, both bits stored in the selected vertical transistor of the transistor arrangement 500 are reset to the second logic value A method for fabricating a transistor arrangement 500 in accordance with the third exemplary embodiment of the invention is now described below. Firstly, a layer arrangement is formed from a substrate 501, a first electrode region 502, a channel layer and an electrode layer. Trenches are then introduced into the layer arrangement, the trenches extending as far as to the first electrode region 502 and, in the process, forming a plurality of channel regions 503 from the channel layer and a plurality of second electrode regions 504 from the electrode layer. Afterward, an electrically insulating layer sequence 505 is formed above the first electrode region 502 and the second electrode regions 504 and laterally at the channel regions 503. Finally, a plurality of gate regions 506 are formed on the electrically insulating layer sequence 505.

In this case, the individual method steps are carried out using known methods such as photolithography, wet-chemical etching, vapor phase epitaxy, ion implantation, cathode sputtering and other methods.

Figure 6:
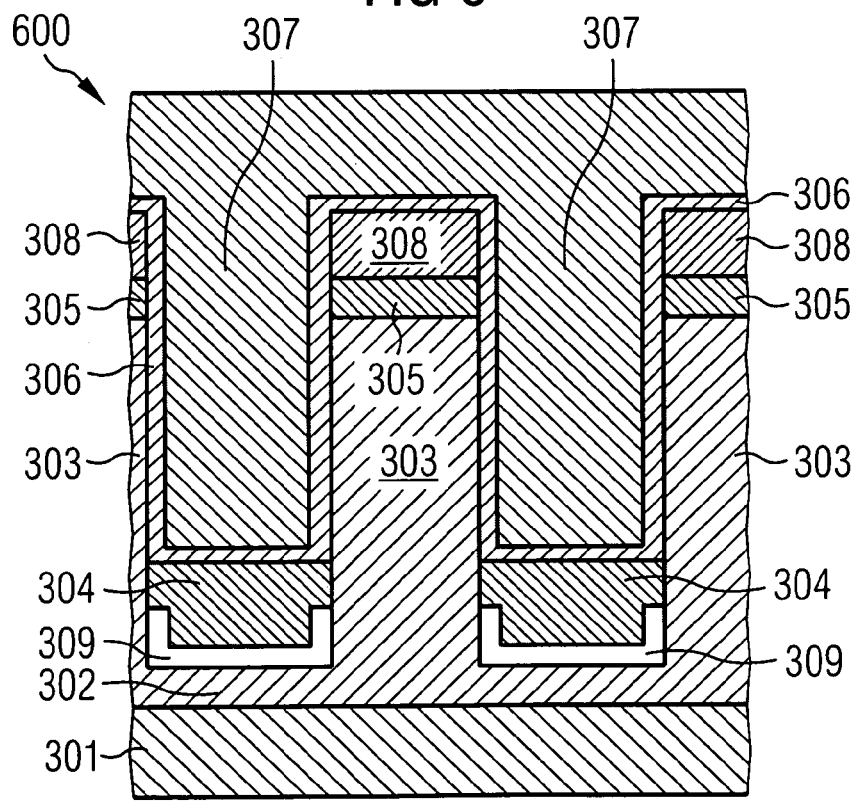
FIG. 6 shows a cross section through a transistor arrangement in accordance with a fourth exemplary embodiment of the invention with a plurality of vertical transistors.

FIG. 6 shows a diagrammatic view of a transistor arrangement 600 in accordance with a fourth exemplary embodiment of the invention with a plurality of vertical transistors.

The transistor arrangement 600 in accordance with the fourth exemplary embodiment differs from the transistor arrangement 300 in accordance with the second exemplary embodiment by the fact that the second electrically insulating region 309 of the transistor arrangement 600 partly surrounds only the first electrode region 304, so that the first electrode region 304 has a contact region with the adjacent channel regions 303 at two locations, and has no touch contact with the first electrically insulating region 308. Consequently, each second electrode region 305 is electrically coupled to in each case two first electrode regions 304 by means of the associated channel region 303, the adjacent gate regions 307 and also the electrically insulating layer sequence 306 arranged in between.

Consequently, each trench introduced into the channel layer 302 has a respective vertical transistor at both sides between the first electrode region 304 arranged underneath and also the two adjoining second electrode regions 305. Each channel region 303 of the transistor arrangement 600 is thus assigned in each case to two vertical transistors.

A quantity of data of two bits can in each case be stored, read and erased in each vertical transistor in accordance with the description relating to FIG. 3. This results, for the transistor arrangement 600, in a quantity of data of four bits for each channel region 303.

In order to fabricate the transistor arrangement 600, recourse is essentially had to the fabrication method described in FIG. 4A to FIG. 4F, only the production step between the layer arrangements illustrated in FIG. 4C and FIG. 4D being altered and the remaining production steps being adapted accordingly.

Instead of the deposition and the selective removal of the silicon dioxide layer above the layer arrangement 400C illustrated in FIG. 4C, the silicon dioxide layer 405 is removed at all uncovered locations. The silicon dioxide layer 405 is thus maintained only below and partly beside the $n^+$-doped first electrode layer 406. The second electrically insulating region 309 is thus produced from the silicon dioxide layer 405. During the deposition and patterning of the layer made of undoped polycrystalline silicon, the gaps between the $n^+$-doped first electrode layer 406 and the two adjoining channel regions 303 are then closed. This then results in the first electrode region 304, which is coupled to the two adjoining channel regions 303.

It will be appreciated by persons skilled in the art that the above embodiments have been described by way of example only and not in any limitative sense. Various alternatives and modifications are possible without departure from the scope of the invention.

The invention claimed is:

1. A transistor arrangement, comprising:
   a substrate, and
   a vertical transistor comprising:
      a first electrode region,
      a second electrode region arranged generally above the first electrode region,
      a channel region between the first electrode region and the second electrode region,
      a gate region beside the channel region,
      an electrically insulating region at least partly surrounding the gate region such that the gate region is electrically decoupled from adjacent vertical transistors, and
      an electrically insulating layer sequence between the gate region and the channel region,
   wherein two mutually spatially separate and electrically decoupled sections of the electrically insulating layer sequence are adapted for storage of charge carriers, and
   wherein an electrically insulating region at least partly surrounding one or both of the first electrode region and the second electrode region electrically decouples said one or both of the first electrode region and the second electrode region from their surroundings with the exception of the channel region and the electrically insulating layer sequence.

2. The transistor arrangement as claimed in claim 1 in which the electrically insulating layer sequence is an ONO layer sequence comprising a first oxide layer, a nitride layer and a second oxide layer.

3. The transistor arrangement as claimed in claim 1, in which one of the two sections of the electrically insulating layer sequence is arranged generally between the channel region, the gate region, and the first electrode region or the second electrode region.

4. The transistor arrangement as claimed in claim 1, in which the channel region is p-doped, and in which the first electrode region and the second electrode region are $n^+$-doped.

5. The transistor arrangement as claimed in claim 1, comprising at least two of the vertical transistors arranged one beside the other in the substrate.

6. The transistor arrangement as claimed in claim 5, in which the first electrode regions of the vertical transistors are electrically coupled to one another.

* * * * *

UNITED STATES PATENT AND TRADEMARK OFFICE
CERTIFICATE OF CORRECTION

PATENT NO. : 7,154,138 B2  Page 1 of 1
APPLICATION NO. : 10/481278
DATED : December 26, 2006
INVENTOR(S) : Franz Hofmann et al.

It is certified that error appears in the above-identified patent and that said Letters Patent is hereby corrected as shown below:

Column 2, line 67, delete "data of in each" and insert in place thereof -- data in each--.

Column 17, line 10, delete Return between "FIG. 4B," and "FIG. 4C,".

Column 17, line 33, delete "$n^{30}$-doped" and insert in place thereof --$n^{+}$-doped--.

Column 23, line 7, delete "value" and insert in place thereof --value "0"--.

Column 23, line 7, begin new paragraph with "A".

Signed and Sealed this

Seventeenth Day of June, 2008

JON W. DUDAS
*Director of the United States Patent and Trademark Office*